US011557567B2

(12) United States Patent
Hoefs et al.

(10) Patent No.: US 11,557,567 B2
(45) Date of Patent: Jan. 17, 2023

(54) METHODS OF ATTACHING DIE TO SUBSTRATE USING COMPLIANT DIE ATTACH SYSTEM HAVING SPRING-DRIVEN BOND TOOL

(71) Applicant: Assembléon B.V., Eindhoven (NL)

(72) Inventors: Rudolphus H. Hoefs, Eindhoven (NL); Roy Brewel, Liempde (NL); Richard A. Van Der Burg, Eindhoven (NL)

(73) Assignee: ASSEMBLEON BV, Eindhoven (NL)

( * ) Notice: Subject to any disclaimer, the term of this patent is extended or adjusted under 35 U.S.C. 154(b) by 0 days.

(21) Appl. No.: 17/412,757

(22) Filed: Aug. 26, 2021

(65) Prior Publication Data

US 2021/0392802 A1 Dec. 16, 2021

Related U.S. Application Data

(62) Division of application No. 16/559,531, filed on Sep. 3, 2019, now Pat. No. 11,134,595.

(Continued)

(51) Int. Cl.
*H01L 23/00* (2006.01)
*H01L 21/67* (2006.01)
(Continued)

(52) U.S. Cl.
CPC ........ *H01L 24/90* (2013.01); *H01L 21/67132* (2013.01); *H01L 21/67144* (2013.01);
(Continued)

(58) Field of Classification Search
CPC .......... H05K 13/0404; H01L 21/67132; H01L 21/67144; H01L 21/6836; H01L 24/741; H01L 24/90
See application file for complete search history.

(56) References Cited

U.S. PATENT DOCUMENTS

| 4,850,780 A | 7/1989 | Safabakhsh et al. |
| 5,351,872 A | 10/1994 | Kobayashi |

(Continued)

FOREIGN PATENT DOCUMENTS

| JP | 10150093 | 6/1998 |
| JP | 2006147702 | 6/2006 |

(Continued)

OTHER PUBLICATIONS

International Search Report from corresponding PCT application No. PCT/EP2019/073566 completed Dec. 9, 2019.

*Primary Examiner* — Michael Jung
(74) *Attorney, Agent, or Firm* — Christopher M. Spletzer, Sr.

(57) ABSTRACT

A die attach system is provided. The die attach system includes: a support structure for supporting a substrate; a die supply source including a plurality of die for attaching to the substrate; and a bond head for bonding a die from the die supply source to the substrate, the bond head including a bond tool having a contact portion for contacting the die during a transfer from the die supply source to the substrate, the bond head including a spring portion engaged with the bond tool such that the spring portion is configured to compress during pressing of the die against the substrate using the contact portion of the bond tool.

20 Claims, 4 Drawing Sheets

Related U.S. Application Data

(60) Provisional application No. 62/727,395, filed on Sep. 5, 2018.

(51) Int. Cl.
   *H01L 21/683* (2006.01)
   *H05K 13/04* (2006.01)
   *H01K 13/04* (2006.01)

(52) U.S. Cl.
   CPC ........ *H01L 21/6836* (2013.01); *H01L 24/741* (2013.01); *H05K 13/0404* (2013.01)

(56) References Cited

U.S. PATENT DOCUMENTS

| | | | |
|---|---|---|---|
| 7,624,492 | B1 | 12/2009 | Katsube et al. |
| 9,633,883 | B2 | 4/2017 | Huska et al. |
| 9,814,144 | B2 | 11/2017 | Brewel et al. |
| 10,062,588 | B2 | 8/2018 | Huska et al. |
| 10,141,215 | B2 | 11/2018 | Wendt et al. |
| 10,410,905 | B1 | 9/2019 | Peterson et al. |
| 10,471,545 | B2 | 11/2019 | Wendt et al. |
| 10,504,767 | B2 | 12/2019 | Peterson et al. |
| 10,529,685 | B2 | 1/2020 | Huska et al. |
| 10,545,372 | B2 | 1/2020 | Peterson et al. |
| 2007/0056157 | A1 | 3/2007 | Hirata et al. |
| 2008/0060750 | A1* | 3/2008 | Wang ............... G06K 19/07749 29/601 |
| 2008/0210368 | A1 | 9/2008 | Zakel et al. |
| 2009/0008032 | A1* | 1/2009 | Wesseling ......... H01L 21/67132 156/750 |
| 2015/0282398 | A1 | 10/2015 | Kawaguchi |
| 2016/0100488 | A1 | 4/2016 | Brewel et al. |
| 2016/0133476 | A1 | 5/2016 | Takahashi et al. |
| 2017/0194171 | A1 | 7/2017 | Peterson et al. |
| 2018/0122673 | A1* | 5/2018 | Wendt ................... H01L 23/544 |
| 2018/0218670 | A1 | 8/2018 | Huska et al. |
| 2018/0248090 | A1 | 8/2018 | Huska et al. |
| 2019/0296182 | A1* | 9/2019 | Ryu ....................... H01L 24/97 |
| 2020/0253100 | A1 | 8/2020 | Kawaguchi et al. |

FOREIGN PATENT DOCUMENTS

| | | |
|---|---|---|
| JP | 2006185941 | 7/2006 |
| JP | 2006324687 | 11/2006 |

* cited by examiner

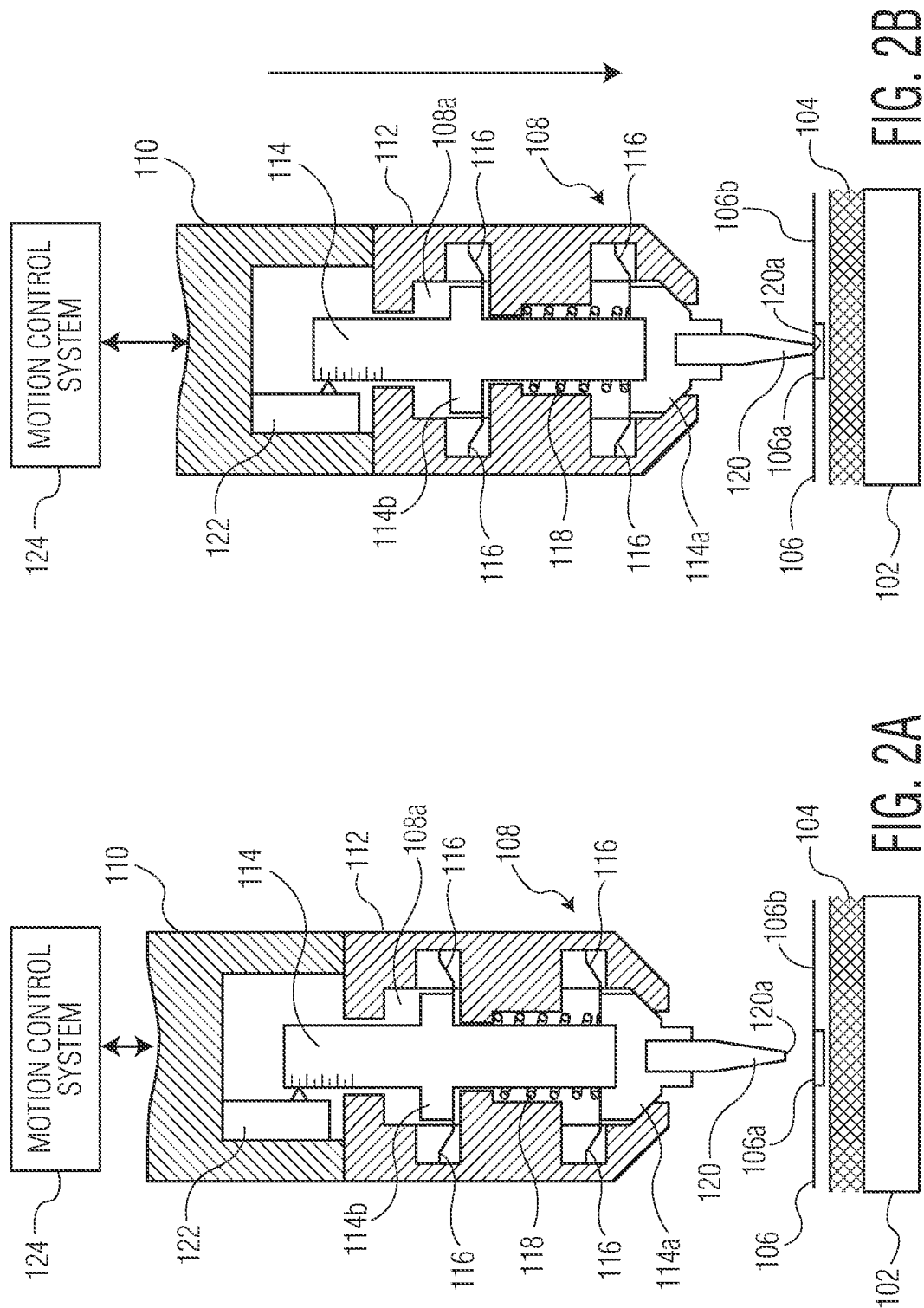

METHODS OF ATTACHING DIE TO SUBSTRATE USING COMPLIANT DIE ATTACH SYSTEM HAVING SPRING-DRIVEN BOND TOOL

CROSS-REFERENCE TO RELATED APPLICATION

This application is a divisional application of U.S. patent application Ser. No. 16/559,531 filed on Sep. 3, 2019, which claims the benefit of U.S. Provisional Application No. 62/727,395, filed Sep. 5, 2018, the content of both of which are incorporated herein by reference.

FIELD

The invention relates to systems and methods for attaching a die to substrate, and more particularly, to improved compliant die attach tools used in connection with attaching a die to a substrate without picking the die from a die supply source.

BACKGROUND

In connection with the placement of a die on a substrate (e.g., semiconductor die attach operations), many conventional applications utilize a "pick and place" operation. In such operations, a die is "picked" from a semiconductor wafer or other die supply source, and then the die is moved to (and "placed" on) a target substrate. Such operations may also utilize one or more transfers between a "pick" tool and a "place" tool.

In other die attach operations, a die supply source (e.g., a wafer including a plurality of die) may be positioned between a bond tool and a substrate. The bond tool may be used to press the die against the substrate while the die is still secured to a film/foil of the die supply source. Thus, the die attach operation is performed without any "picking" and "placing" operation. However, such operations tend to suffer from a number of deficiencies such as poor control of bond force between the bond tool and the die during the bonding operation.

Thus, it would be desirable to provide improved die attach systems, and related methods, for overcoming one or more deficiencies of convention die attach systems.

SUMMARY

According to an exemplary embodiment of the invention, a die attach system is provided. The die attach system includes: a support structure for supporting a substrate; a die supply source including a plurality of die for attaching to the substrate; and a bond head for bonding a die from the die supply source to the substrate, the bond head including a bond tool having a contact portion for contacting the die during a transfer from the die supply source to the substrate, the bond head including a spring portion engaged with the bond tool such that the spring portion is configured to compress during pressing of the die against the substrate using the contact portion of the bond tool.

According to another exemplary embodiment of the invention, a method of attaching a die to a substrate is provided. The method includes the steps of: providing a die supply source including a plurality of die for attaching to the substrate, the die supply source being positioned between a bond tool and a support structure supporting the substrate; and moving the bond tool, carried by a bond head, downward such that a contact portion of the bond tool contacts the die to transfer the die from the die supply source to the substrate. The bond head includes a spring portion engaged with the bond tool such that the spring portion is configured to compress during pressing of the die against the substrate using the contact portion of the bond tool.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

FIGS. 2A-2D are a series of side sectional views of a portion of a die attach system in accordance with an exemplary embodiment of the present invention.

DETAILED DESCRIPTION

Figure 1A:
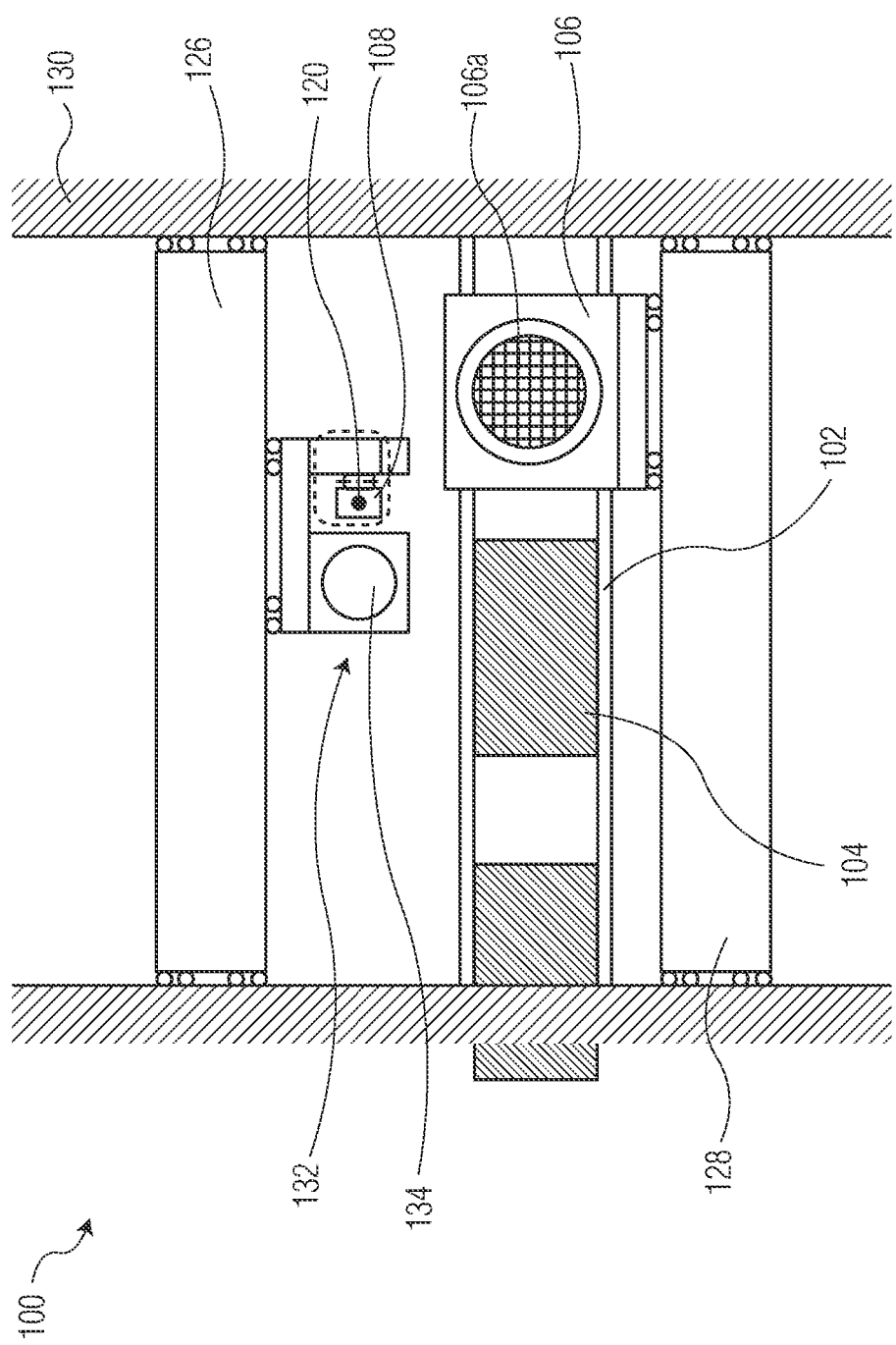
FIGS. 1A-1C are block diagram views illustrating elements of a die attach system in accordance with an exemplary embodiment of the present invention.

Certain die attach applications do not utilize a pick and place operation. For example, a die supply source (e.g., a wafer including a plurality of die, such as an LED wafer or other source of LED die) may be positioned between a bond tool and a substrate. Die (e.g., an LED die) included in the die supply source may be attached to a film/foil or the like.

According to certain exemplary aspects of the invention, after alignment between the bond tool, the die to be attached, and a placement location of the substrate—the bond tool presses the die against the placement location of the substrate. Adhesive on a lower surface of the die (and/or on the placement location of the substrate) is provided such that the die is now secured to the substrate. Such bond tools may include a plurality of pins (e.g., actuatable pins, which may actuated independent of one another) for contacting the die in connection with a transfer from the die supply source to the substrate.

As used herein, the term "die" is intended to refer to any structure including (or configured to include at a later step) a semiconductor chip or die. Exemplary "die" elements include a bare semiconductor die including a bare LED semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, amongst others.

According to certain exemplary embodiments of the present invention, in a die attachment system a bond head is used to attach a die to a substrate. The bond head includes a holder (e.g., a shaft portion) and a bond tool (e.g., a needle) coupled to the holder. The bond tool may be suspended in a housing of the bond head and can move in at least one direction (e.g., along a vertical z-axis of the die attached system). In this way, the housing portion of the bond head is decoupled from the bond tool. The bond head includes a detection system (e.g., a sensor for detecting an amount of compression of the spring portion during bonding of the die to the substrate) for detecting (e.g., measuring) movement of the bond tool relative to the bond tool housing. The die attach system controls the movement of the bond tool on the basis of the signal delivered by the detection system. In certain embodiments of the invention, no such detection system or sensor is utilized. For example, control of the bond tool may be accomplished using other information that may be available. For example, motor current of the z-actuator (that drives the bond head along the z-axis, as part of a motion system—see element 124 in FIGS. 2A-2D) may be used to determine height and/or to control motion of the bond tool.

Exemplary situations for use of the die attach system include: (i) the bond head may include a detection system to enable relative position measurement between the bond tool housing and the bond tool; and (ii) the bond head may be used without such a detection system.

Exemplary purposes of various aspects of the invention include one or more of the following: (i) reducing impact mass that the bond tool exerts on a die during die attach to a substrate; (ii) controlling the force exerted by the bond tool on the die being attached; (iii) controlling the amount of compression of a spring portion of a bond head; (iv) determining a point in time of collision of the die on the substrate during die attach; and (v) determining a collision height of the die on the substrate.

Figure 1C:
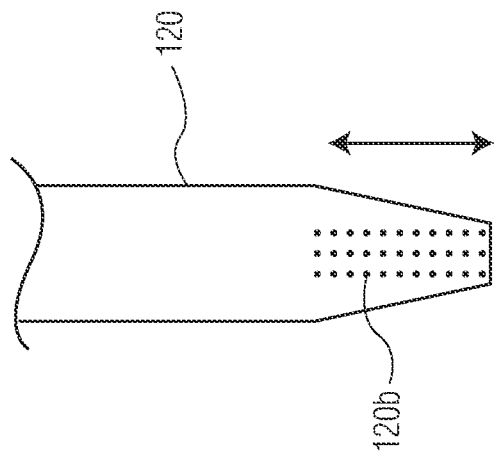
Figure 1B:
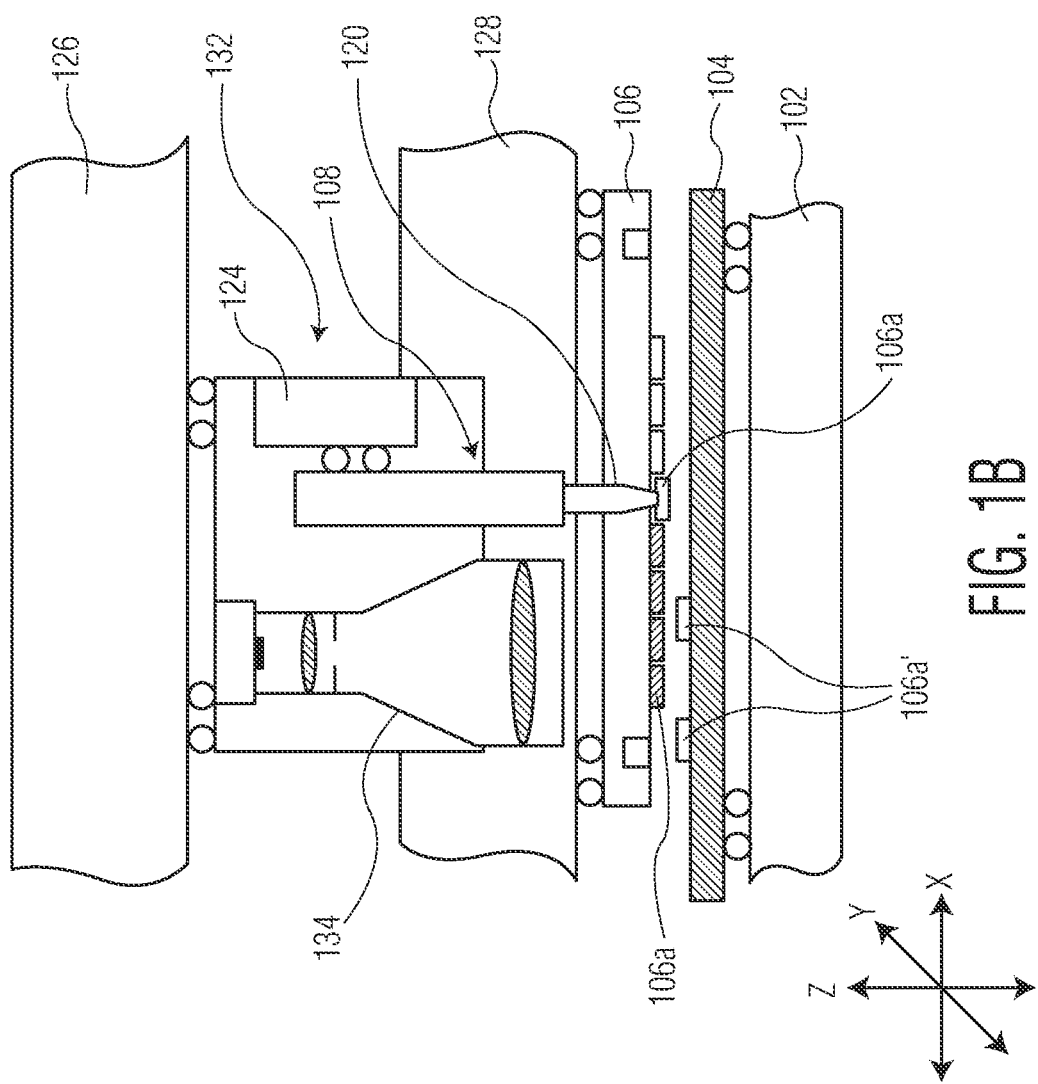

FIG. 1A illustrates die attach system 100. Die attach system 100 includes a support structure 102 for supporting a substrate 104, a die supply source 106 including a plurality of die 106a configured to be attached to substrate 104, and a bond head 108 (which is configured to be driven along a z-axis using motion system 124) including a bond tool 120 for contacting die 106a during a transfer of die 106a from die supply source 106 to substrate 104. Die attach system 100 also includes a bond head support 126 and a supply support 128. Bond head support 126 and supply support 128 are each mounted on machine structure 130 such that bond head support 126 and supply support 128 are independently moveable relative to machine structure 130. Bond head support 126 supports intermediate support structure 132 (which is moveable with respect to bond head support 126), which supports moveable bond head 108. Intermediate support structure 132 carries a camera 134 (and other visions system components) for use in connection with alignment and/or inspection operations. Die supply source 106 is moveably mounted on supply support 128. In the exemplary embodiment of the invention shown in FIG. 1A (and in FIG. 1B), during a die attach operation, die supply source 106 is positioned between bond tool 120 and substrate 104 supported by support structure 102. FIG. 1B is a cross-sectional side view of elements of die attach system 100, with camera 134 and bond tool 120 positioned over substrate 104. Two "bonded" die 106a' have been bonded to substrate 104 at respective bonding locations and bond tool 120 is shown engaging another die 106a above a third respective bonding location on substrate 104. FIG. 1C illustrates a block diagram of an example of bond tool 120. More specifically, bond tool 120 may include at least one pin 120b for contacting die 106a in connection with a transfer from die supply source 106 to substrate 104. Further, as shown in FIG. 1C, bond tool 120 may include a plurality of pins 120b for contacting die 106a in connection with a transfer from die supply source 106 to substrate 104. Each of the plurality of pins 120b may be separably, or collectively, moveable (e.g., along a vertical axis) with respect to the remainder of bond tool 120 to transfer die 106a to substrate 104. Of course, bond tool 120 including one or more pins 120b (as shown in FIG. 1C) is an example of bond tool 120. In other embodiments of the invention, bond tool 120 may not include pins 120b, but may transfer die 106a without pins 120b. Further still, FIGS. 2A-2D illustrate bond tool 120 without pins 120b, such that a single structure is driven along the z-axis. In embodiments of the invention where bond tool 120 includes a plurality of pins 120b, such pins may include an additional actuator(s) for moving pins 120b separately from one another (or together) as desired to accomplish the die transfer.

FIGS. 2A-2D are a series of side sectional views, of a specific configuration of elements of die attach system 100. As provided above, die attach system 100 includes support structure 102 for supporting substrate 104, and die supply source 106 (e.g., wherein the die supply source includes an LED wafer, and the plurality of die are a plurality of LED die) including a plurality of die 106a for attaching to substrate 104. For example, die supply source 106 includes a flexible film 106b, where the plurality of die 106a are attached to flexible film 106b. Die attach system 100 includes bond head 108 for bonding die 106a from die supply source 106 to substrate 104. Bond head 108 including a bond tool 120 (e.g., including a needle, a pin, a plurality of pins that are separately moveable along a vertical axis, etc.) (wherein bond tool 120, such as the plurality of pins, contacts die 106a in connection with the transfer from die supply source 106 to substrate 104) having a contact portion 120a for contacting die 106a during a transfer from die supply source 106 to substrate 104. Bond head 108 includes a spring portion 118 engaged with bond tool 120 such that spring portion 118 is configured to compress during pressing of die 106a against substrate 104 using contact portion 120a of bond tool 120. Thus, bond tool 120 is spring loaded. In the example shown in FIGS. 2A-2D, the engagement between spring portion 118 and bond tool 120 is via a shaft portion 114 (e.g., a needle holder) included in bond head 108. Bond tool 120 is secured to shaft portion 114 (either directly or indirectly). Shaft portion 114 is configured to move along a vertical axis (e.g., a z-axis of die attach system 100).

More specifically, bond head 108 includes a z-actuator portion 110 coupled to (either directly or indirectly) a bond tool housing 112. Bond head 108 defines an interior aperture 108a allowing for motion of shaft portion 114 along the aforementioned vertical axis. Spring portion 118 is engaged with a portion of shaft portion 114. A plurality of linear guides 116 (e.g., play-free, frictionless, linear guides) are coupled between shaft portion 114 and bond tool housing 112. A stepped portion 114b of shaft 114 is configured to travel within a portion of interior aperture 108a. Shaft portion 114 includes a pretensioned conical portion 114a configured to rest against an angled interior surface of interior aperture 108a. More specifically, pretensioned conical portion 114a is under "tension" because of a force provided by spring portion 118 which pushes against another stepped portion 114c of shaft portion 114.

Figure 2C:
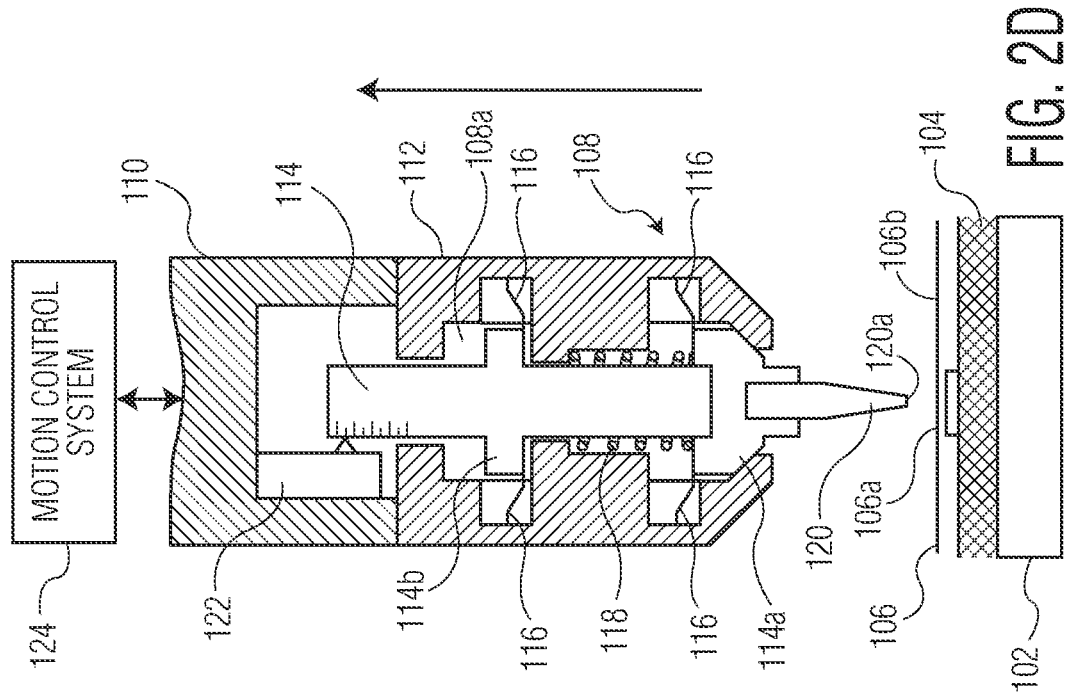

Referring specifically to FIG. 2A, bond tool 120 is positioned above one of the plurality of die 106a (i.e., die supply source 106 is positioned between substrate 104 and bond tool 120). In FIG. 2A, bond tool 120 (coupled to shaft 114, directly or indirectly) is in a lower position within its range of motion with respect to bond tool housing 112. In FIG. 2B, bond head 108 has been moved downward such that contact portion 120a of bond tool 120 touches die 106a of die supply source 106. Bond head 108 continues to move downward such that film 106b begins to move (i.e., flex) downward toward substrate 104. Spring portion 118 begins compression during contact between the contact portion 120a and die 106a prior to pressing of die 106a against substrate 104 using contact portion 120a of bond tool 120 (i.e., the compression in spring portion 118 is shown in the difference between FIG. 2B and FIG. 2C).

FIG. 2C illustrates die 106a being pressed against substrate 104 by bond tool 120 (e.g., with a force being equal to the displacement of bond tool 120 times the spring constant of spring portion 118). That is, bond tool 120 (coupled to shaft 114, directly or indirectly) is now in an upper position within its range of motion with respect to bond tool housing 112. The displacement of bond tool 120 is measured by a displacement measuring device 122 (e.g., where the displacement measuring device may include a position sensor), which is included in z-actuator portion 110. A displacement signal (e.g., provided by displacement measuring device 122) is used by motion system 124 (for moving bond head 108) to stop the z-axis movement of bond head 108 at a position corresponding to a predefined downward pressing force (i.e., the position shown in FIG. 2C). It should be understood that such a displacement signal may be used "real time" (in connection with a present die attach operation, or such a displacement signal may be used in connection with subsequent die attach operations.

Figure 2D:
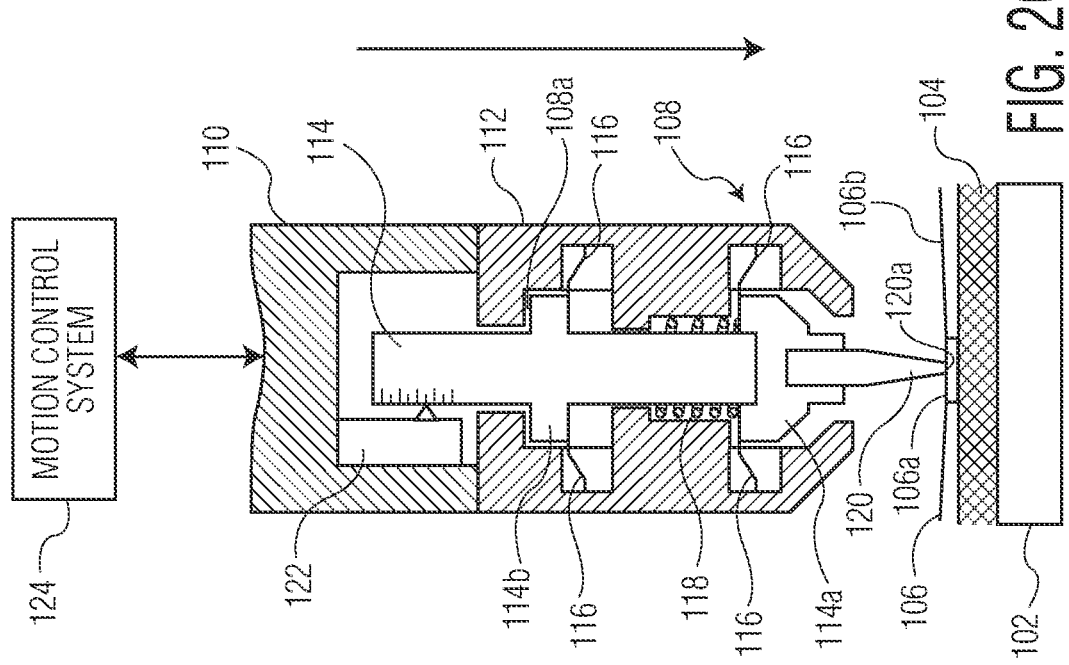

After a bonding time (also referred to as a "dwell" time, i.e., the time during which bond tool 120 maintains the preset downward pressing force), motion system 124 begins to raise bond head 108 upward as shown in FIG. 2D. Die 106a is now bonded to substrate 104 (e.g., due a holding force by an adhesive included on substrate 104 and/or die 106a) (where at least one of die 106a, and a bonding location of substrate 104, includes adhesive for securing die 106a to the bonding location after the transfer from die supply source 106 to substrate 104). That is, as bond tool 120 is moved upward (carried by bond head 108), die 106a is released from film 106b through a "jerk" movement of bond tool 120. This jerk movement of bond tool 120 is caused by the upward movement of bond tool 120 as it returns to the lower position within its range of motion with respect to bond tool housing 112, due to the spring force.

Die attach system 100 is configured to control descent of bond tool 120 (included in bond head 108) during the bonding of die 106a to substrate 104 based on feedback from displacement measuring device 122. For example, displacement measuring device 122 includes a position sensor for detecting an amount of compression of spring portion 118 during bonding of die 106a to substrate 104.

Displacement measuring device 122 may vary within the scope of the invention, and may operate in connection with motion system 124. Further, predetermined data may be used in connection with the operation of motion system 124. Such predetermined data may relate to (i) an amount of compression of spring portion 118 to provide a desirable bonding of die 106a to substrate 104, where the amount of compression is related to a z-axis position of at least one of (a) a portion of bond head 108, and (b) a portion of bond tool 120; and/or (ii) an amount of bond force to be applied to provide a desirable bonding of die 106a to substrate 104, wherein the amount of bond force is related to a z-axis position of at least one of (a) a portion of bond head 108, and (b) a portion of bond tool 120.

Exemplary benefits over conventional tools (and related die attach systems) may include: (i) reducing forces exerted on a die during die attach; (ii) optimizing output by minimizing move distances; (iii) enabling accurate height teaching in the system; and (iv) detecting irregular height variations which can cause process errors. Examples are detection of obstructions on substrates, detection of missing dies on source\substrate, and detection of system malfunction.

While the invention has been described and illustrated primarily with respect to die attach operations where there is no "pick" operation, it is not limited thereto. The invention has broad applicability in the semiconductor bonding industry including die attach machines (sometimes referred to as die bonders) or other packaging machines (e.g., flip chip machines/operations, advanced packaging operations, etc.).

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the claims and without departing from the invention.

What is claimed:

1. A method of attaching a die to a substrate, the method comprising the steps of:
   providing a die supply source including a plurality of die for attaching to the substrate, the die supply source being positioned between a bond tool and a support structure supporting the substrate;
   moving the bond tool, carried by a bond head, downward such that a contact portion of the bond tool contacts the die to transfer the die from the die supply source to the substrate, the bond head including a spring portion engaged with the bond tool such that the spring portion is configured to compress during pressing of the die against the substrate using the contact portion of the bond tool; and
   detecting an amount of compression of the spring portion during bonding of the die to the substrate using a sensor.

2. The method of claim 1 wherein the spring portion compresses during contact between the contact portion and the die in connection with the transfer of the die to the substrate using the contact portion of the bond tool.

3. The method of claim 1 further comprising the step of determining a collision height of the die on the substrate.

4. The method of claim 1 further comprising the step of controlling descent of the bond tool during the moving step based on feedback from the sensor.

5. The method of claim 1 further comprising the step of determining predetermined data, the predetermined data being related to an amount of compression of the spring portion to provide a desirable bonding of the die to the substrate.

6. The method of claim 5 wherein the amount of compression is related to a z-axis position of at least one of (i) a portion of the bond head, and (ii) a portion of the bond tool.

7. The method of claim 1 further comprising the step of determining predetermined data, the predetermined data being related to an amount of bond force to be applied to provide a desirable bonding of the die to the substrate.

8. The method of claim 7 wherein the amount of bond force is related to a z-axis position of at least one of (i) a portion of the bond head, and (ii) a portion of the bond tool.

9. The method of claim 1 wherein the bond tool includes at least one pin for contacting the die in connection with the transfer from the die supply source to the substrate.

10. The method of claim 1 wherein the bond tool includes a plurality of pins for contacting the die in connection with the transfer from the die supply source to the substrate.

11. The method of claim 10 wherein the plurality of pins are actuatable.

12. The method of claim 1 wherein the die supply source includes an LED wafer, and the plurality of die are a plurality of LED die.

13. The method of claim 1 wherein at least one of (i) the die, and (ii) a bonding location of the substrate configured to receive the die, includes adhesive for securing the die to the bonding location after the transfer from the die supply source to the substrate.

14. The method of claim 13 further comprising the step of releasing the die from the film through a jerk movement of the bond tool.

15. The method of claim 1 wherein the die supply source includes a film, the plurality of die being attached to the film.

16. The method of claim 1 further comprising the step of controlling motion of the bond tool using a motor current of an actuator for driving the bond head.

17. The method of claim 1 further comprising the step of determining a height of the bond tool using a motor current of an actuator for driving the bond head.

18. The method of claim 1 wherein the sensor detects the amount of compression of the spring portion by detecting movement of the bond tool relative to a bond tool housing.

19. The method of claim 1 wherein the bond head includes a z-actuator portion, the sensor being included in the actuator portion.

20. The method of claim 1 further comprising the step of stopping movement of the bond head at a position corresponding to a predefined downward pressing force.

* * * * *